(12) United States Patent
Suh et al.

(10) Patent No.: US 8,993,991 B2
(45) Date of Patent: Mar. 31, 2015

(54) SEMICONDUCTOR DEVICES INCLUDING A NANOWIRE AND METHODS OF MANUFACTURING THE SAME

(75) Inventors: Dongwoo Suh, Daejeon (KR); Sung Bock Kim, Daejeon (KR); Hojun Ryu, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 224 days.

(21) Appl. No.: 13/193,690

(22) Filed: Jul. 29, 2011

(65) Prior Publication Data

US 2012/0145999 A1 Jun. 14, 2012

(30) Foreign Application Priority Data

Dec. 14, 2010 (KR) ........................ 10-2010-0127787

(51) Int. Cl.
*H01L 29/06* (2006.01)
*B82Y 10/00* (2011.01)
*B82Y 40/00* (2011.01)
(Continued)

(52) U.S. Cl.
CPC ............. *H01L 29/0673* (2013.01); *B82Y 10/00* (2013.01); *B82Y 40/00* (2013.01); *H01L 29/068* (2013.01); *H01L 29/66439* (2013.01); *H01L 29/775* (2013.01); *H01L 29/78696* (2013.01); *H01L 21/02381* (2013.01); *H01L 21/0245* (2013.01); *H01L 21/02532* (2013.01); *H01L 21/02603* (2013.01); *H01L 21/02639* (2013.01);
(Continued)

(58) Field of Classification Search
CPC ..................... H01L 21/02603; H01L 29/0669; H01L 29/0673; H01L 29/068; H01L 29/66439; H01L 29/775; H01L 29/78696; B82Y 40/00
USPC .............. 257/12, 255, 288, E29.07, E29.245; 977/762
See application file for complete search history.

(56) References Cited

U.S. PATENT DOCUMENTS 7,485,908 B2 * 2/2009 Anwar et al. ................. 257/296
7,560,366 B1   7/2009 Romano et al.
(Continued)

FOREIGN PATENT DOCUMENTS

KR  2010-0025836 A  3/2010
KR  2010-0098236 A  9/2010

OTHER PUBLICATIONS

Wei Lu et al., "Nanowire Transistor Performance Limits and Applications", IEEE Transactions on Electron Devices, vol. 55, No. 11, Nov. 2008, pp. 2859-2876.

*Primary Examiner* — Jay C Kim
(74) *Attorney, Agent, or Firm* — Rabin & Berdo, P.C.

(57) ABSTRACT

Provided are semiconductor devices and methods of manufacturing the same. The semiconductor device includes a substrate including a first top surface, a second top surface lower in level than the first top surface, and a first perpendicular surface disposed between the first and second top surfaces, a first source/drain region formed under the first top surface, a first nanowire extended from the first perpendicular surface in one direction and being spaced apart from the second top surface, a second nanowire extended from a side surface of the first nanowire in the one direction, being spaced apart from the second top surface, and including a second source/drain region, a gate electrode on the first nanowire, and a dielectric layer between the first nanowire and the gate electrode.

12 Claims, 13 Drawing Sheets

(51) Int. Cl.
  *H01L 29/66* (2006.01)
  *H01L 29/775* (2006.01)
  *H01L 29/786* (2006.01)
  *H01L 21/02* (2006.01)

(52) U.S. Cl.
  CPC .... H01L 21/02645 (2013.01); H01L 21/02653 (2013.01); *Y10S 977/762* (2013.01)
  USPC ........ 257/12; 257/255; 257/288; 257/E29.07; 257/E29.245; 977/762

(56) References Cited

U.S. PATENT DOCUMENTS

| | | | |
|---|---|---|---|
| 8,097,515 B2 * | 1/2012 | Bangsaruntip et al. | 438/282 |
| 8,298,881 B2 * | 10/2012 | Sleight et al. | 438/151 |
| 8,324,030 B2 * | 12/2012 | Bangsaruntip et al. | 438/151 |
| 8,614,492 B2 * | 12/2013 | Bryant et al. | 257/417 |
| 2011/0012090 A1 * | 1/2011 | Singh et al. | 257/24 |
| 2012/0068150 A1 * | 3/2012 | Bangsaruntip et al. | 257/9 |
| 2012/0280292 A1 * | 11/2012 | Bjoerk et al. | 257/288 |

* cited by examiner

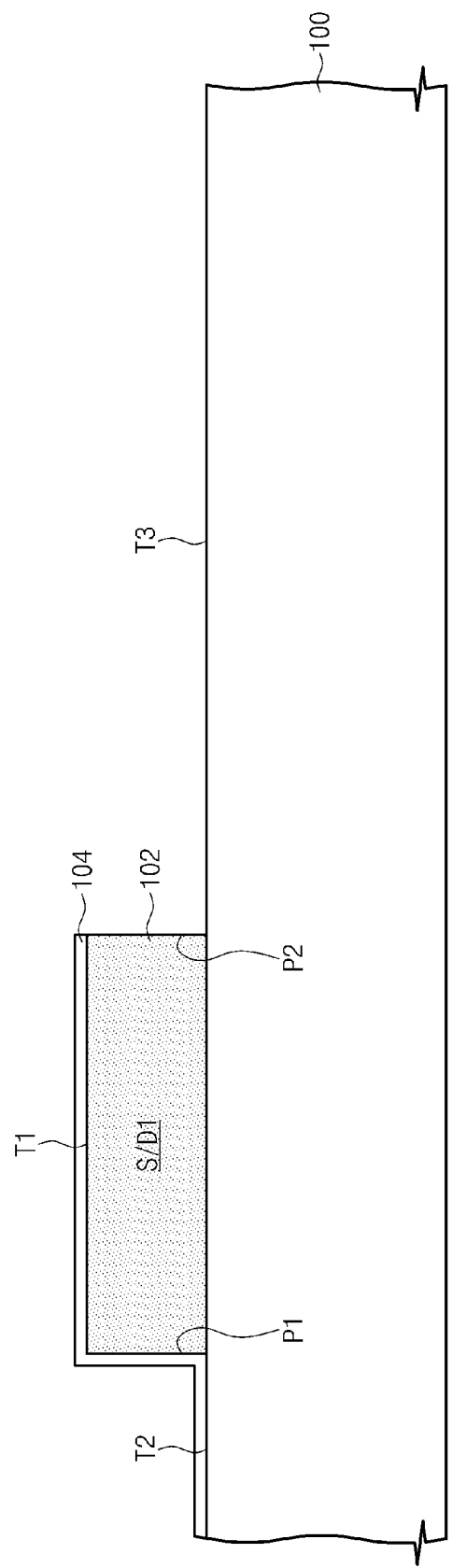

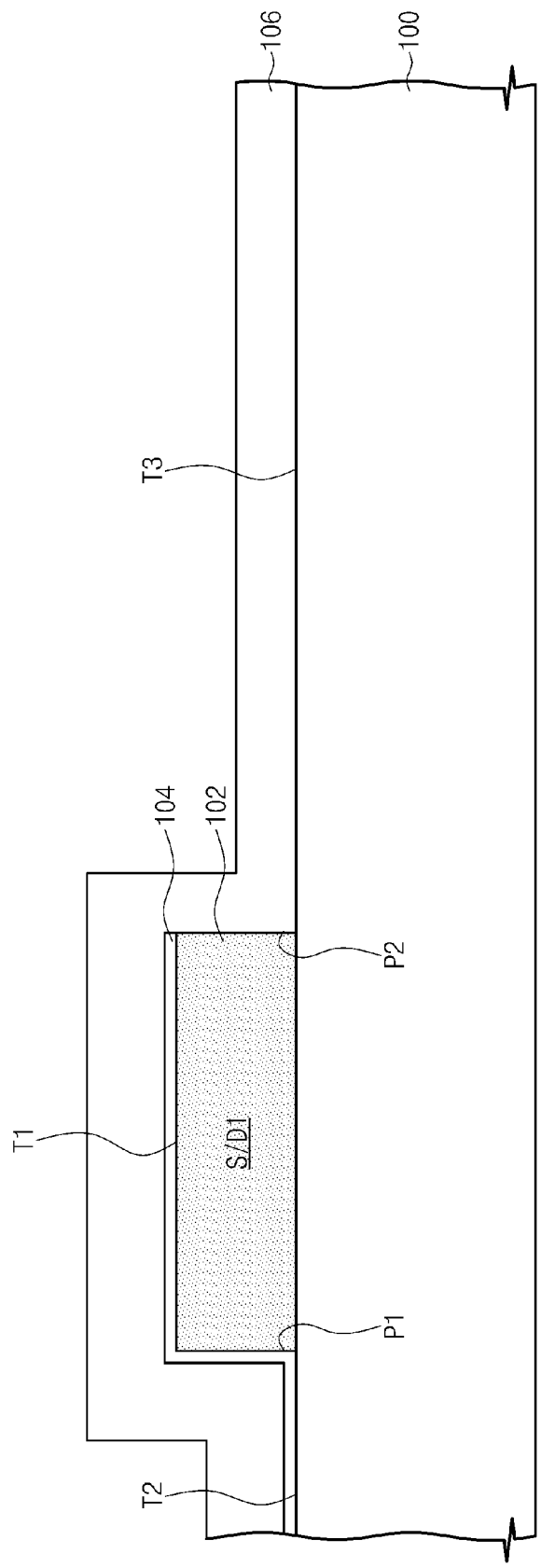

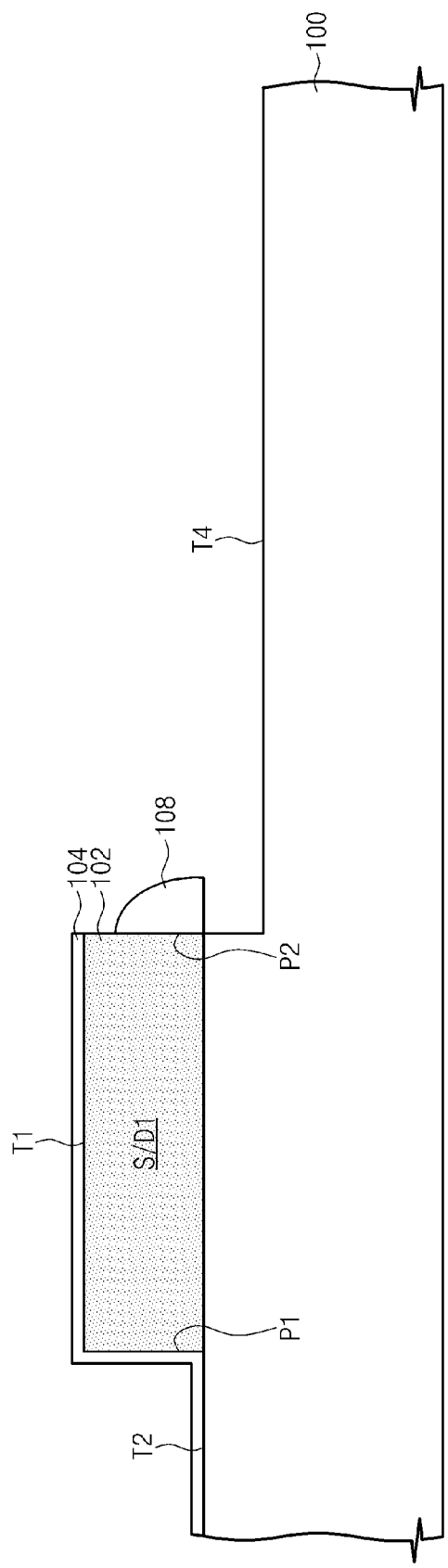

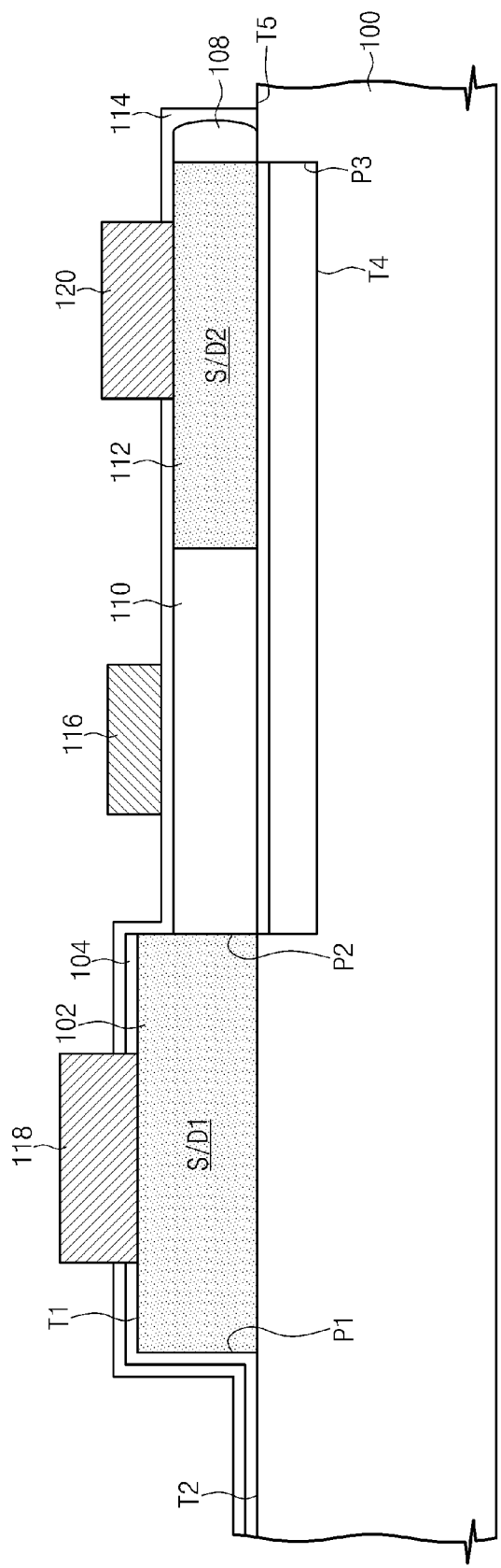

SEMICONDUCTOR DEVICES INCLUDING A NANOWIRE AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2010-0127787, filed on Dec. 14, 2010, the entirety of which is incorporated by reference herein.

BACKGROUND

The present disclosure herein relates to semiconductor devices and methods of manufacturing the same and, more particularly, to semiconductor devices including a transistor and methods of manufacturing the same.

A nanowire crystal may be a mesoscopic system between a macroscopic system and a microscopic system in size. The nanowire crystal may be a similar one-dimensional nano crystal structure with various applications (e.g. semiconductor device) due to a quantum confinement effect and/or a ballistic transport characteristic thereof. Thus, it has been tried that a field effect transistor is formed using a nanowire. Generally, the nanowire may be grown by a separated process, and then the nanowire may be located on a predetermined place. For example, the nanowire vertically grown on a substrate may be separated from the substrate, and then the separated nanowire may be located between source/drain regions formed on another substrate. The field effect transistor formed using the above method may not be highly integrated. Also, it may be difficult to form integrated circuits (e.g. semiconductor devices) by the vertical growth method of the nanowire.

SUMMARY

Embodiments of the inventive concept may provide semiconductor devices capable of minimizing defects caused by alignment and/or growth direction of a nanowire.

Embodiments of the inventive concept may provide methods of easily manufacturing semiconductor devices capable of defects caused by alignment and/or growth direction of a nanowire.

According to example embodiments of the inventive concepts, a semiconductor device may include: a substrate including a first top surface, a second top surface lower in level than the first top surface, and a first perpendicular surface, the first and second top surfaces connected via the first perpendicular surface; a first source/drain region formed under the first top surface; a first nanowire extended from the first perpendicular surface in one direction, and being spaced apart from the second top surface; a second nanowire extended from a side surface of the first nanowire in the one direction, being spaced apart from the second top surface, and including a second source/drain region; a gate electrode formed on the first nanowire; and a dielectric layer formed between the first nanowire and the gate electrode.

In some embodiments, the substrate may further include a third top surface disposed at a side of the first top surface and being higher in level than the second top surface and a second perpendicular surface. The first and third top surfaces may be connected via the second perpendicular surface.

In other embodiments, the semiconductor device may further include a nucleated seed disposed on a side surface of the second nanowire. The second nanowire may be disposed between the nucleated seed and the first nanowire.

In still other embodiments, the substrate may further include a third top surface disposed at one side of the second top surface and being higher in level than the second top surface. In this case, the first top surface may be disposed at another side of the second top surface opposite to the one side, and the nucleated seed may be in contact with the third top surface.

In yet other embodiments, the semiconductor device may further include a protection layer disposed on the first top surface.

In yet still other embodiments, the first and second nanowires may make one-body, and the first and second nanowires may be extended to be parallel to the second top surface.

In further embodiments, the first and second nanowires may make one-body, and the first and second nanowires may be extended in a direction making acute angle with the first perpendicular surface.

In still further embodiments, each of the first and second nanowires may include a core having a first material; and a shell surrounding the core and having a second material different from the first material.

In even further embodiments, the semiconductor device may further include a first conductive pattern electrically connected to the first source/drain region; and a second conductive pattern electrically connected to the second source/drain region.

According to example embodiments of the inventive concepts, a method of fabricating a semiconductor device may include: preparing a substrate including a first top surface, a second top surface being lower in level than the first top surface, and a perpendicular surface, the first and second top surfaces connected via the perpendicular surface; forming a first source/drain region under the first top surface; forming a nucleated seed being spaced apart from the second top surface and suspending on the perpendicular surface; forming a first nanowire using the nucleated seed, the first nanowire extended from the perpendicular surface in one direction and spaced apart from the second top surface; forming a second nanowire using the nucleated seed, the second nanowire extended from the first nanowire in the one direction, spaced apart from the second top surface, and doped with dopants; and sequentially forming a dielectric layer and a gate electrode on the first nanowire. The first nanowire may include a channel region, and the second nanowire may function as a second source/drain region.

In some embodiments, preparing the substrate may include: partially etching an initial substrate to form a substrate having the first top surface and a third top surface, the third top surface lower in level than the first top surface and higher in level than the second top surface; forming a protection layer on the first top surface of the substrate having the first and third top surfaces; and etching the third top surface to form the substrate having the first top surface and the second top surface.

In other embodiments, etching the third top surface may include isotropically etching the third top surface using an etching solution. The protection layer may include a material having an etch selectivity with respect to the substrate, and the first top surface covered by the protection layer may not be substantially etched by the etching solution.

In still other embodiments, forming the nucleated seed may include: forming a nucleated seed layer on the substrate having the first top surface and the third top surface; and anisotropically etching the nucleated seed layer to form the nucleated seed on a perpendicular surface connecting the first and third top surfaces.

In yet other embodiments, the method may further include performing a thermal treatment process to the nucleated seed.

In yet still other embodiments, the first nanowire may be formed by a chemical vapor deposition (CVD) process using the nucleated seed, and the first nanowire may be grown by a vapor liquid solid (VLS) mechanism.

In further embodiments, the second nanowire may be formed by a chemical vapor deposition process (CVD) using the nucleated seed, the second nanowire may be grown by a vapor liquid solid (VLS) mechanism, and the second nanowire may be doped in-situ during the CVD process.

In still further embodiments, forming the first nanowire and forming the second nanowire may be performed in-situ.

BRIEF DESCRIPTION OF THE DRAWINGS

The inventive concept will become more apparent in view of the attached drawings and accompanying detailed description.

FIGS. 1A through 1J are cross sectional views illustrating methods of manufacturing semiconductor devices according to some embodiments of the inventive concept;

FIG. 3 is a cross sectional view illustrating a semiconductor device according to still another embodiment of the inventive concept.

DETAILED DESCRIPTION OF THE EMBODIMENTS

Figure 1A:
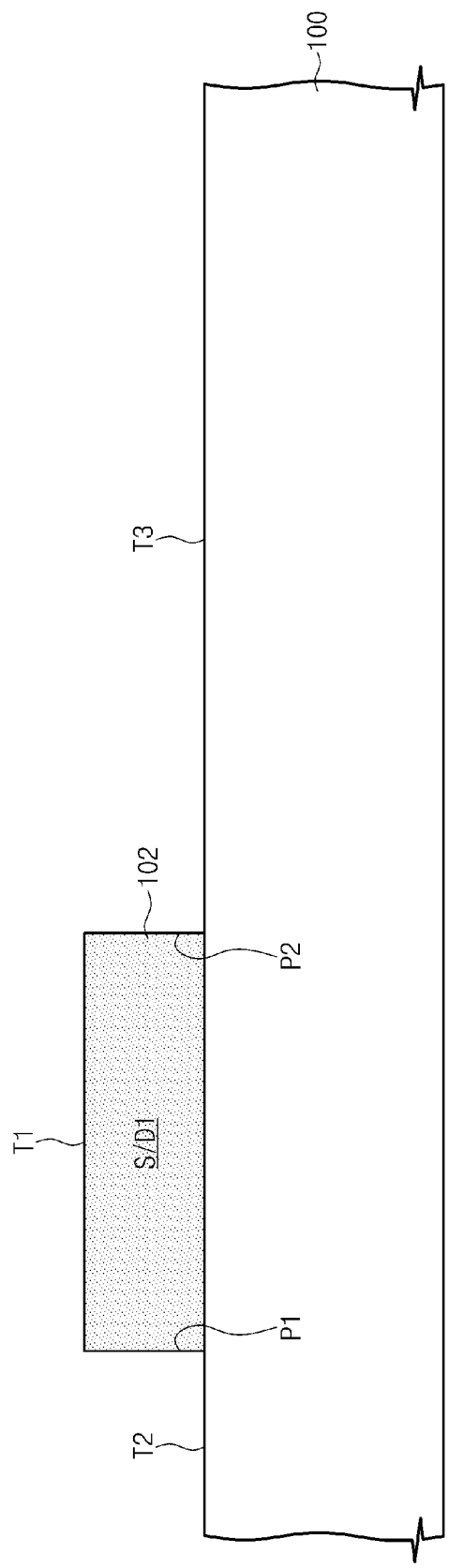

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1A through 1J are cross sectional views illustrating methods of manufacturing semiconductor devices according to some embodiments of the inventive concept.

Referring to FIG. 1A, an initial substrate (not shown) having a first top surface T1 may be partially etched to form a substrate 100 including a second top surface T2 and a third top surface T3.

In more detail, the initial substrate may be a semiconductor substrate including silicon and/or germanium. The initial substrate may include the first top surface T1. After a mask (not shown) is formed on the initial substrate, the initial substrate may be etched using the mask as an etch mask to form the substrate 100 having a protruding portion 102.

The protruding portion 102 may be a portion of the initial substrate covered by the mask, thus, the protruding portion 102 may have the first top surface T1. The second and third top surfaces T2 and T3 substantially lower in level than the first top surface T1 may be disposed at both sides of the protruding portion 102. The second and third top surfaces T2 and T3 may be exposed. The second and third top surfaces T2 and T3 may substantially be in the same plane. Also, the protruding portion 102 may further include a first perpendicular surface P1 and a second perpendicular surface P2. The first and second top surfaces T1 and T2 may be connected via the first perpendicular surface P1, and the first and third top surfaces T1 and T3 may be connected via the second perpendicular surface P2.

A first source/drain region S/D1 doped with first dopants may be formed in the protruding portion 102. The first dopants may be p type dopants or n type dopants. According to an embodiment, after forming the first source/drain region S/D1 in the initial substrate, the initial substrate may be partially etched to form the protruding portion 102. According to another embodiment, after the protruding portion 102 is formed, the first source/drain region S/D1 may be formed in the protruding portion 102. However, the inventive concept is not limited thereto.

Referring to FIG. 1B, a protection layer 104 may be formed to cover the first top surface T1, the first perpendicular surface P1 and the second top surface T2 of the substrate 100.

The protection layer 104 may protect the first top surface T1, the first perpendicular surface P1, and the second top surface T2 of the substrate 100 in subsequent processes. The protection layer 104 may include a material having an etch selectivity with respect to the substrate 100. For example, the protection layer 104 may not be substantially etched when the substrate 100 is etched using an etching solution.

Referring to FIG. 1C, a nucleated seed layer 106 may be formed on the protection layer 104, the second perpendicular surface P2 and the third top surface T3 of the substrate 100.

According to an embodiment of the inventive concept, the substrate 100 may include silicon and the nucleated seed layer 106 may include gold (Au). In an embodiment, the nucleated seed layer 106 may be deposited as a thin layer. In another embodiment, the nucleated seed layer 106 may be formed by a coating method.

Figure 1D:
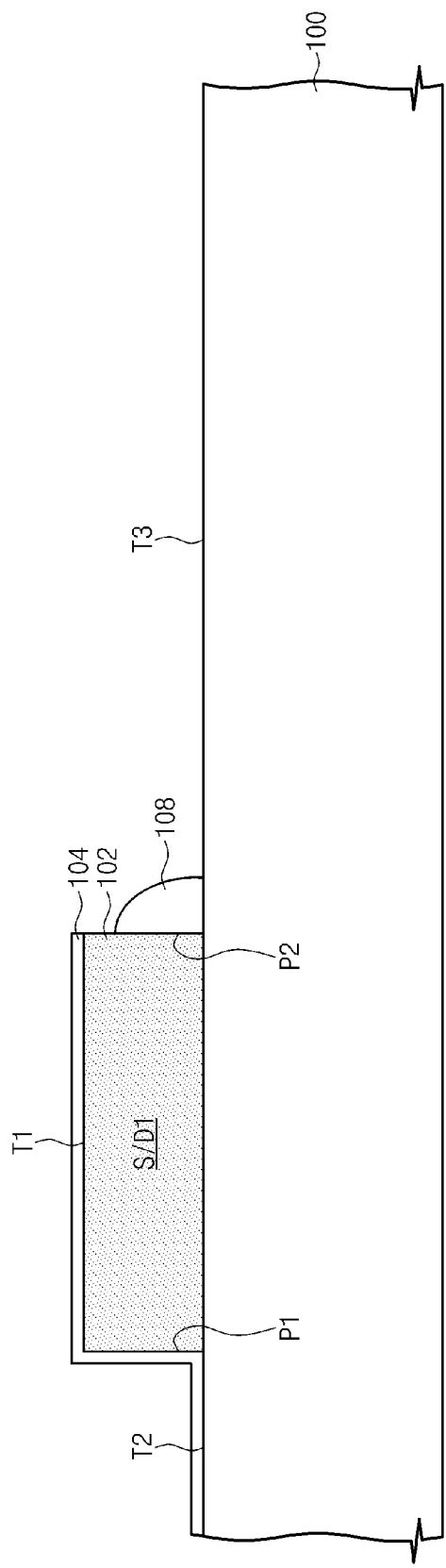

Referring to FIG. 1D, the nucleated seed layer 106 may be etched to form a nucleated seed 108 on the second perpendicular surface P2.

According to embodiments of the inventive concept, the nucleated seed layer 106 may be etched through an anisotropic etching process. For example, the anisotropic etching process may be an inductively coupled plasma (ICP) etching process and/or a reactive ion etching (RIE) process. When the anisotropic etching process is performed, most of the nucleated seed layer 106 on the first, second and third top surfaces T1, T2 and T3 may be substantially etched, and the nucleated seed layer 106 on the second perpendicular surface P2 may be partially etched. Thus, the nucleated seed 108 may be formed to be in contact with the second perpendicular surface P2 and a portion of the third top surface T3 adjacent to the second perpendicular surface P2. Therefore, the nucleated seed 108 may be formed to be self-aligned with the substrate 100.

A side surface of the nucleated seed 108 may be a perpendicular surface corresponding to the second perpendicular surface P2, and another side surface of the nucleated see 108 may be a gently curved surface. Also, a bottom surface of the nucleated seed 108 may be a horizontal surface corresponding to the third top surface T3. A width of the nucleated seed 108 may become narrower toward the top thereof. The nucleated seed 108 may have a substantially sharp top corner.

In some embodiments, a process removing the nucleated seed layer 106 on the first perpendicular surface P1 may be further performed.

Referring to FIG. 1E, the third top surface T3 may be etched to form a substrate 100 having a fourth top surface T4 separated from the bottom surface of the nucleated seed 108.

In more detail, the substrate 100 may be etched by an isotropic etching process. The isotropic etching process may be a wet etching process. In some embodiments, the wet etching process may be performed using an etching solution which enables the substrate 100 to be etched substantially faster than the nucleated seed 108 and/or the protection layer 104. As a result, when the exposed third top surface T3 is etched by the wet etching process, the first top surface T1, the first perpendicular surface P1 and the second top surface T2 may not be etched by the protection layer 104. For example, in case that the substrate 100 includes silicon and the nucleated seed 108 includes gold, the wet etching process may be performed using an etching solution including potassium hydroxide (KOH).

The third top surface T3 may be etched by the wet etching process to form the fourth top surface T4 substantially lower than the third top surface T3. Also, the bottom surface of the nucleated seed 108 may be separated from the fourth top surface T4. Thus, the nucleated seed 108 may have an isolated shape suspending on the second perpendicular surface P2.

Figure 1F:
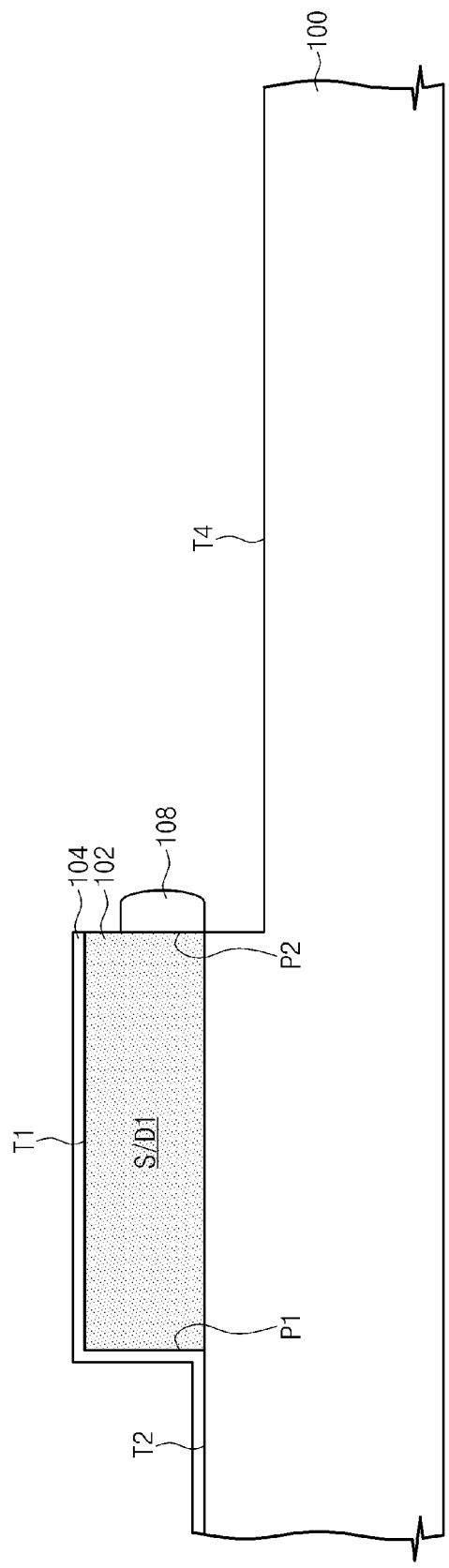

Referring to FIG. 1F, a thermal treatment process may be performed to the substrate 100 on which the nucleated seed 108 is formed.

Because the nucleated seed 108 includes metal, a shape of the nucleated seed 108 may be changed by the thermal treatment process. As illustrated in FIG. 1E, prior to the thermal treatment process, the width of the nucleated seed 108 may become narrower toward the top thereof and the nucleated seed 108 may substantially have a sharp top corner. After the thermal treatment process, as illustrated in FIG. 1F, the nucleated seed 108 may substantially have a gentle corner.

In another embodiment, the thermal treatment process may be omitted for simplification of a manufacture process.

Figure 1G:
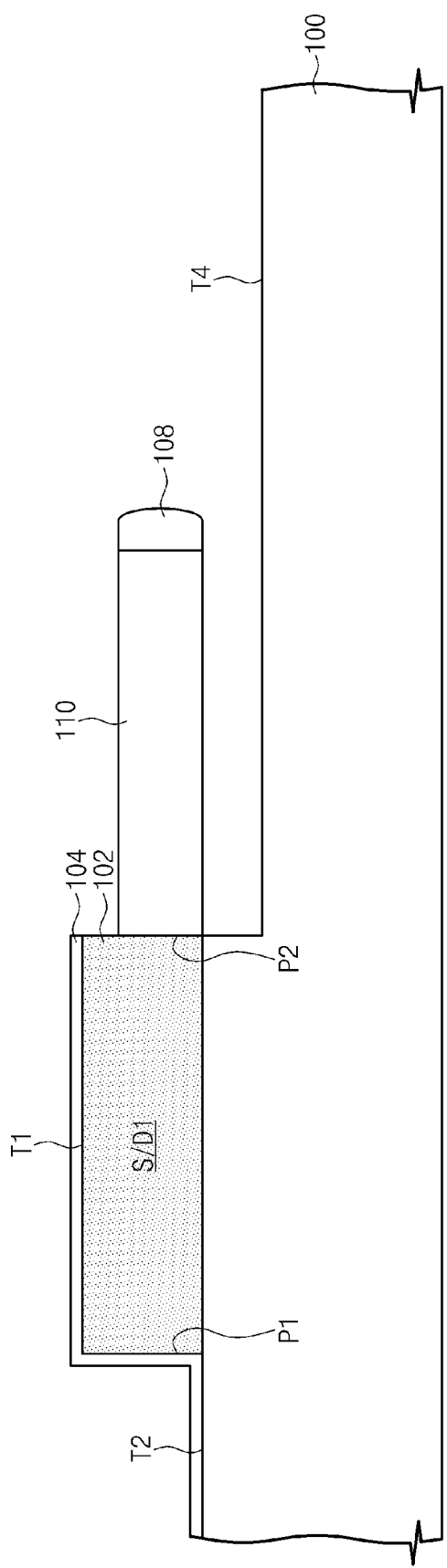

Referring to FIG. 1G, a first nanowire 110 extended from the second perpendicular surface P2 may be formed using the nucleated seed 108.

The first nanowire 110 may be grown by a vapor-liquid-solid (VLS) mechanism using a chemical vapor deposition (CVD) process. The VLS mechanism may be performed by the CVP process. A vapor may be absorbed directly on a surface of a solid by the VLS mechanism, so that a crystal growth rate may be improved. With the VLS mechanism, a supersaturated liquid rapidly absorbing the vapor may be introduced in a crystal growth process, and the crystal growth process may be performed using the supersaturated liquid and the nucleated seed 108 having a phase between a liquid phase and a solid phase.

According to some embodiments of inventive concept, a source gas may be provided to the substrate 100 having the nucleated seed 108. For example, the nucleated seed 108 may include gold, and the source gas may include a silane ($SiH_4$) gas. The source gas may be provided at a temperature being equal to or higher than a eutectic point of gold and silicon. For example, the eutectic point of gold and silicon may be about 363 degrees Celsius. Silicon separated from the silane gas at the temperature may be dissolved in the nucleated seed 108 to form a supersaturated liquid. Silicon in the supersaturated liquid may be precipitated in a direction, thereby growing the first nanowire 110.

The first nanowire 110 may be extended in a direction substantially perpendicular to the second perpendicular surface P2. In another embodiment, the first nanowire 110 may be extended in a direction making an acute angle with the second perpendicular surface P2. Also, the first nanowire 110 may be spaced apart from the fourth top surface T4 by a predetermined distance. The first nanowire 110 may function as a channel region of a field effect transistor.

Figure 1H:
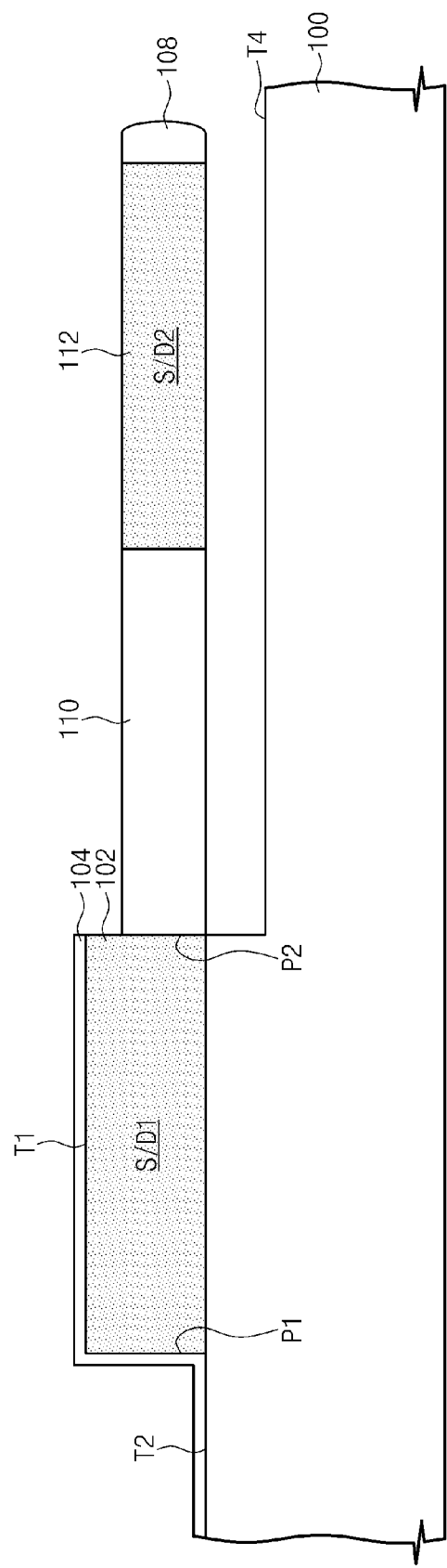

Referring to FIG. 1H, a second nanowire 112 may be formed from the first nanowire 110 using the nucleated seed 108.

In an embodiment, a formation process of the second nanowire 112 may be substantially the same as that of the first nanowire 110. However, second dopants may be provided during the growth of the second nanowire 112, so that the second nanowire 112 may be doped with the second dopants. That is, the second nanowire 112 may be doped in-situ. The second dopants may have the same conductivity as that of the first dopants. For example, when the first dopants are p type dopants, the second dopants may be the p type dopants. When the first dopants are n type dopants, the second dopants may be the n type dopants.

In another embodiment, after formation of the second nanowire 112, the second dopants may be provided into the second nanowire 112 by an ion implantation process.

The first and second nanowires 110 and 112 may be sequentially formed in a single process chamber. That is, the first and second nanowires 110 and 112 may be formed in-situ.

The second nanowire 112 may be extended in a direction substantially perpendicular to the second perpendicular surface P2. In another embodiment, the second nanowire 112 may be extended in a direction making an acute angle with the second perpendicular surface P2. Also, the second nanowire 112 may be spaced apart from the fourth top surface T4 by a predetermined distance. Thus, the first and second nanowires 110 and 112 may be laterally grown and be spaced apart from the fourth top surface T4 by a predetermined distance.

The second nanowire 112 including the second dopants may be a second source/drain region S/D2 corresponding to the first source/drain region S/D1.

The first and second nanowires 110 and 112 may be formed to be extended in a direction parallel to the top surfaces T1, T2, and T4 of the substrate 100, and dopants may be provided into the second nanowire 112 to form the second source/drain region S/D2. As a result, the manufacture processes of the first and second nanowires 110 and 112 may be simplified as compared with general processes. Also, defects caused due to alignment and/or growth direction of conventional nanowires may be prevented.

Figure 1I:
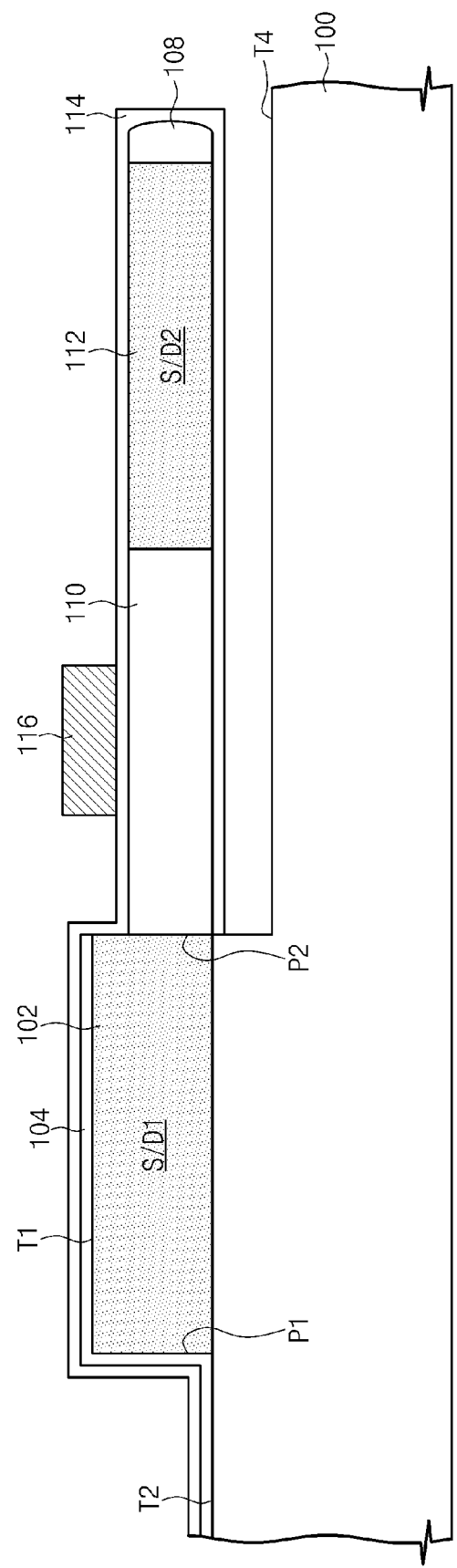

Referring to FIG. 1I, a dielectric layer 114 may be formed on the protection layer 104 and the nanowires 110 and 112. A gate electrode 116 may be formed on the first nanowire 110 on which the dielectric layer 114 is formed.

In embodiments, the first and second nanowires 110 and 112 may be spaced apart from the fourth top surface T4 to have an isolated structure suspending on the second perpendicular surface P2. The dielectric layer 114 may surround the first and second nanowires 110 and 112 due to the structure of the first and second nanowires 110 and 112. The dielectric layer 114 may include a high-k dielectric material (e.g. metal oxide) having a dielectric constant higher than that of silicon oxide. For example, the high-k dielectric material in the dielectric layer 114 may include aluminum oxide ($Al_2O_3$), hafnium oxide (HfO), and/or zirconium oxide (ZrO). The dielectric layer 114 may be formed by a chemical vapor deposition process and/or an atomic layer deposition process.

The gate electrode 116 may cover at least a portion of the first nanowire 110 on which the dielectric layer 114 is formed. The gate electrode 116 may include silicon doped with dopants, metal, and/or metal oxide. For example, the gate electrode 116 may include aluminum (Al), copper (Cu), and/or gold (Au). The gate electrode 116 may be insulated from the first nanowire 110 by the dielectric layer 114.

Therefore, the field effect transistor including the source/drains S/D1 and S/D2, the dielectric 114 and the gate electrode 116 may be formed.

Figure 1J:
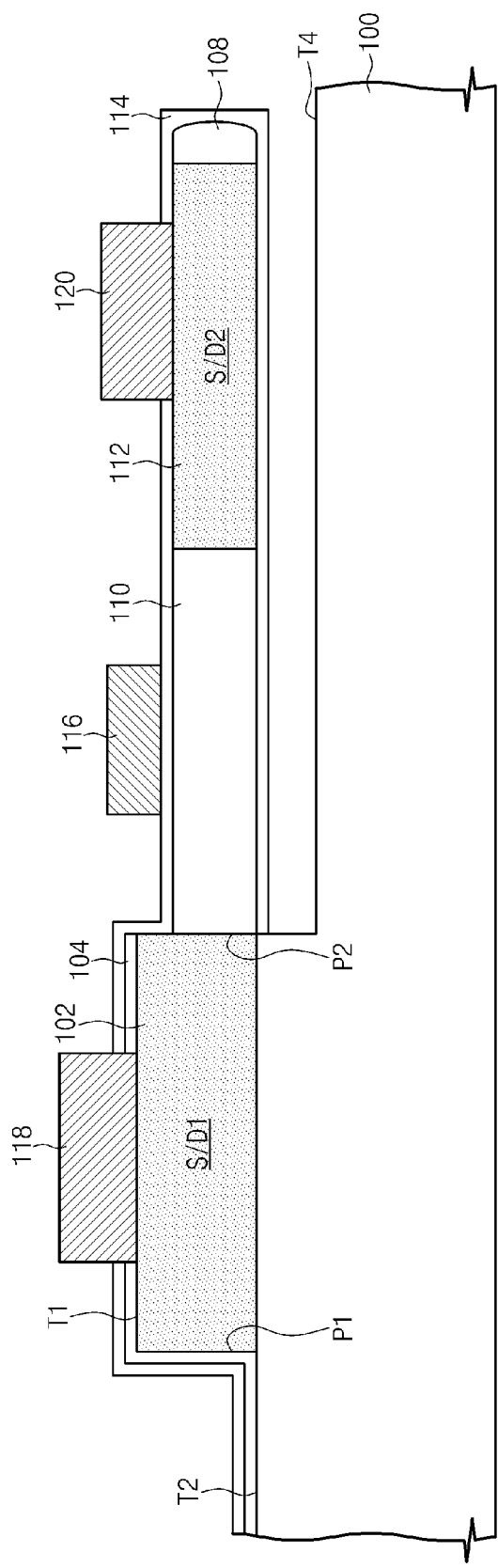

Referring to FIG. 1J, a first conductive pattern 118 and a second conductive pattern may be formed. The first and second conductive patterns 118 and 120 may be electrically connected to the first and second source/drain regions S/D1 and S/D2, respectively.

In more detail, the dielectric layer 114 and the protection layer 104 may be selectively etched to expose a portion of the first source/drain region S/D1. The dielectric layer 114 may be selectively etched to expose a portion of the second source/drain region S/D2. The first conductive pattern 118 may be formed on the exposed first source/drain region S/D1, and the second conductive pattern 120 may be formed on the exposed second source/drain region S/D2.

Semiconductor devices according to embodiments of the inventive concept will be described hereinafter.

Figure 2A:
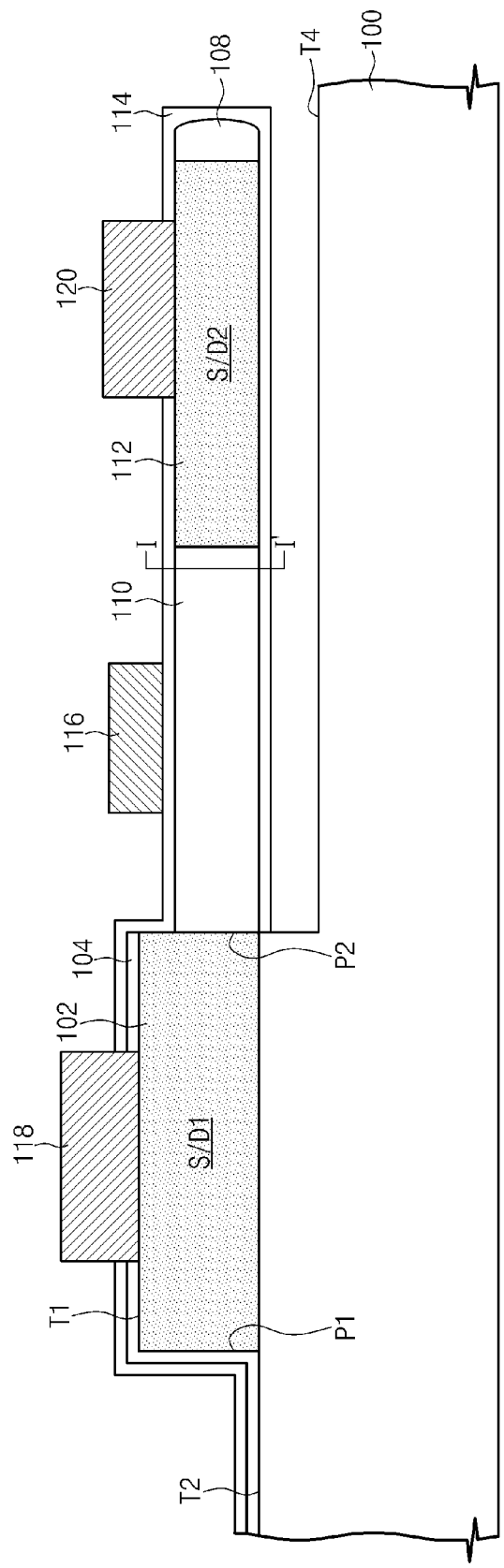
FIG. 2A is a cross sectional view illustrating a semiconductor device according to an embodiment of the inventive concept.
Figure 2B:
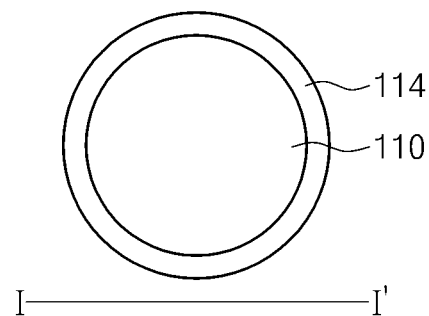
FIG. 2B is a cross sectional view taken along I-I' of FIG. 2A to illustrate a first nanowire in a semiconductor device, according to an embodiment of the inventive concept.
Figure 2C:
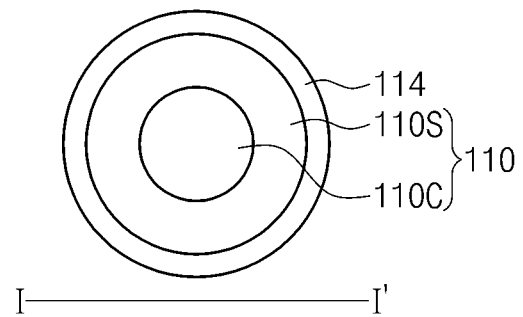
FIG. 2C is a cross sectional view taken along I-I' of FIG. 2A to illustrate a first nanowire in a semiconductor device, according to another embodiment of the inventive concept.

FIG. 2A is a cross sectional view illustrating a semiconductor device according to an embodiment of the inventive concept. FIG. 2B is a cross sectional view taken along I-I' of FIG. 2A to illustrate a first nanowire in a semiconductor device, according to an embodiment of the inventive concept, and FIG. 2C is a cross sectional view taken along I-I' of FIG. 2A to illustrate a first nanowire in a semiconductor device, according to another embodiment of the inventive concept.

Referring to FIG. 2A, the semiconductor device according to embodiments of the inventive concept may include the first source/drain region S/D1, the second source/drain region S/D2, the channel region, the dielectric layer 114, the gate electrode 116, and the first and second conductive patterns 118 and 120 which are formed on the substrate 100.

The substrate 100 may have the protruding portion 102. The protruding portion 102 may have the first top surface T1. The substrate 100 may further have the second top surface T2 located at a side of the protruding portion 102, and the fourth top surface T4 located at another side of the protruding portion 102. The second and fourth top surfaces T2 and T4 may be adjacent to the protruding portion 102. The first top surface T1 may be substantially higher in level than the second top surface T2, and the second top surface T2 may be substantially higher in level than the fourth top surface T4. The substrate 100 may further include the first perpendicular surface P1 and the second perpendicular surface P2. The first top surface T1 and the second top surface T2 may be connected via the first perpendicular surface P1, and the first top surface T1 and the fourth top surface T4 may be connected via the second perpendicular surface P2.

The protection layer 104 may be disposed on the second top surface T2, the first perpendicular surface P1, and the first top surface T1. The protection layer 104 may include a material having an etch selectivity with respect to the substrate 100.

The first source/drain region S/D1 may be formed in the protruding portion 102. The channel region may be defined in the first nanowire 110 extended from the second perpendicular surface P2 of the protruding portion 102. The first nanowire 110 may be spaced apart from the fourth top surface T4 by a predetermined distance. In an embodiment, the first nanowire 110 may be extended in a direction substantially perpendicular to the second perpendicular surface P2. In another embodiment, the first nanowire 110 may be extended in a direction making an acute angle with the second perpendicular surface P2. The first nanowire 110 may have an isolated structure suspending on the second perpendicular surface P2.

The second source/drain region S/D2 may be formed in the second nanowire 112 extended from the first nanowire 110. An extended direction of the second nanowire 112 may be substantially the same as that of the first nanowire 110. In an embodiment, the second nanowire 112 may be extended in a direction perpendicular to the second perpendicular surface P2. In another embodiment, the second nanowire 112 may be extended in a direction making an acute angle with the second perpendicular surface P2. The second nanowire 112 may be spaced apart from the fourth top surface T4 by a predetermined distance.

The second source/drain region S/D2 may include the same dopants as the second source/drain region S/D1. The nucleated seed 108 may be disposed on an end of the second source/drain region S/D2. In other words, the nucleated seed 108 may be disposed on a side surface of the nanowire 112, and the second nanowire 112 may be disposed between the first nanowire 110 and the nucleated seed 108. In an embodiment, the first nanowire 110, the second nanowire 112 and the nucleated seed 108 may be arranged along a direction parallel to the fourth top surface T4 in the order named. In another embodiment, the first nanowire 110, the second nanowire 112 and the nucleated seed 108 may be arranged along the direction making an acute angle with the second perpendicular surface P2 in the order named.

The first and second nanowires 110 and 112 may make one-body without an interface therebetween. As illustrated in FIG. 2B, the nanowire 110 may be formed of a single material. Thus, the second nanowire 112 may be formed of a single material.

Alternatively, as illustrated in FIG. 2C, the nanowire 110 may include a core 110C having a first material and a shell 110S having a second material different from the first material. In this case, the second nanowire 112 may include a core having the first material and a shell having the second material. The cores of the first and second nanowires 110 and 112 may be connected to each other, and the shells of the first and second nanowires 110 and 112 may be connected to each other.

The dielectric layer 114 may be disposed on the channel region and the source/drain regions S/D1 and S/D2. In more detail, the dielectric layer 114 may surround the first and second nanowires 110 and 112 in which the channel region and the second source/drain region S/D2 are formed. Also, the dielectric layer 114 may cover at least a portion of the first source/drain region S/D1.

The gate electrode 116 may be disposed over the channel region on which the dielectric layer 114 is formed. The dielectric layer 114 may insulate the gate electrode 116 from the channel region.

The first conductive pattern 118 may be electrically connected to the first source/drain region S/D1. The second conductive pattern 120 may be electrically connected to the second source/drain region S/D2.

A semiconductor device according to still another embodiment of the inventive concept will be hereinafter described with reference to FIG. 3.

In the present embodiment, the same elements as described in the first embodiment will be indicated by the same reference numerals or the same reference designators. For the purpose of ease and convenience in explanation, the descriptions to the same elements as in the first embodiment will be omitted or mentioned briefly. That is, differences between the present embodiment and the first embodiment will be mainly described hereinafter.

FIG. 3 is a cross sectional view illustrating a semiconductor device according to still another embodiment of the inventive concept.

Referring to FIG. 3, the semiconductor device according to embodiments of the inventive concept may include the first source/drain region S/D1, the second source/drain region S/D2, the channel region, the dielectric layer 114, the gate electrode 116, and the first and second conductive patterns 118 and 120 which are formed on a substrate 100.

The substrate 100 may have the protruding portion 102. The protruding portion 102 may have the first top surface T1. The substrate 100 may further have the second top surface T2 located at a side of the protruding portion 102 and the fourth top surface T4 located at another side of the protruding portion 102. The second and fourth top surfaces T2 and T4 may be adjacent to the protruding portion 102. The first top surface T1 may be substantially higher in level than the second top surface T2, and the second top surface T2 may be substantially higher in level than the fourth top surface T4. The substrate 100 may further include the first perpendicular surface P1 and the second perpendicular surface P2. The first top surface T1 and the second top surface T2 may be connected via the first perpendicular surface P1, and the first top surface T1 and the fourth top surface T4 may be connected via the second perpendicular surface P2.

The substrate 100 may further include a fifth top surface T5 disposed at a side of the fourth top surface T4. The fifth top surface T5 may be higher in level than the fourth top surface T4. The fifth top surface T5 and the second top surface T2 may be in the same plane. That is, the fifth top surface T5 may be disposed at substantially the same level as that of the second top surface T2. The substrate 100 may further include a third perpendicular surface P3. The fourth and fifth top surfaces T4 and T5 may be connected via the third perpendicular surface P3.

The nucleated seed 108 on the side surface of the second nanowire 112 may be disposed on the fifth top surface T5. In an embodiment, the nucleated seed 108 may be in contact with the fifth top surface T5.

According to embodiments of the inventive concept, the first and second nanowires may be extended in a direction non-vertical to the top surfaces of the substrate, and the second source/drain region is formed by providing dopants into the second nanowire. As a result, the manufacture process of the semiconductor device may be simplified. Also, the nucleated seed may be formed by the anisotropic etching process, thereby being self-aligned with the substrate.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
    a substrate including a first top surface, a second top surface lower in level than the first top surface, and a first perpendicular surface, the first and second top surfaces connected via the first perpendicular surface;

a first region doped with dopants and formed on the first top surface;

a first nanowire extended away from the first perpendicular surface in one direction, and being spaced apart from the second top surface, the first nanowire including a channel region touching the first region;

a second nanowire extended from the first nanowire in the one direction, being spaced apart from the second top surface, and including a second region doped with dopants and directly contacting the channel region, wherein the first region is a source and the second region is a drain, or the first region is a drain and the second region is a source;

a gate electrode formed on the first nanowire; and a dielectric layer formed between the first nanowire and the gate electrode.

2. The semiconductor device of claim 1, wherein the substrate further comprises:

a third top surface disposed at a side of the first top surface, and being higher in level than the second top surface; and a second perpendicular surface, and wherein the first and third top surfaces are connected via the second perpendicular surface.

3. The semiconductor device of claim 1, further comprising:

a nucleated seed disposed on a side surface of the second nanowire, wherein the second nanowire is disposed between the nucleated seed and the first nanowire.

4. The semiconductor device of claim 3, wherein the substrate further comprises a third top surface disposed at one side of the second top surface and being higher in level than the second top surface;

wherein the first top surface is disposed at another side of the second top surface opposite to the one side; and wherein the nucleated seed is in contact with the third top surface.

5. The semiconductor device of claim 1, further comprising:

a protection layer disposed on the first top surface.

6. The semiconductor device of claim 1, wherein the first and second nanowires make one-body; and wherein the first and second nanowires are extended to be parallel to the second top surface.

7. The semiconductor device of claim 1, wherein the first and second nanowires make one-body; and wherein the first and second nanowires are extended in a direction making an acute angle with the first perpendicular surface.

8. The semiconductor device of claim 1, wherein each of the first and second nanowires comprises:

a core having a first material; and a shell surrounding the core and having a second material different from the first material.

9. The semiconductor device of claim 1, further comprising:

a first conductive pattern electrically connected to the first region; and a second conductive pattern electrically connected to the second region.

10. The semiconductor device of claim 1, further comprising:

a nucleated seed made of gold and disposed on a side surface of the second nanowire, the nucleated seed for growing the first and second nanowires, wherein the second nanowire is disposed between the nucleated seed and the first nanowire.

11. The semiconductor device of claim 1, wherein each of the first and second nanowires comprises a core, having a first material, and a shell that surrounds and touches the core, has a second material different from the first material, and is both coaxial and coextensive with the core.

12. The semiconductor device of claim 1, wherein the first region is formed above the first top surface.

* * * * *